United States Patent [19]

Casey et al.

[11] 4,405,406

[45] Sep. 20, 1983

[54] PLASMA ETCHING PROCESS AND APPARATUS

[75] Inventors: Martin J. Casey, Mesa, Ariz.; John E. Sheppard, Bensalem, Pa.

[73] Assignee: Sperry Corporation, New York, N.Y.

[21] Appl. No.: 386,826

[22] Filed: Jun. 9, 1982

Related U.S. Application Data

[63] Continuation of Ser. No. 171,790, Jul. 24, 1980, abandoned.

[51] Int. Cl.³ .................... H01L 21/306; B44C 1/22; C03C 15/00; C03C 25/06
[52] U.S. Cl. .................... 156/643; 156/646; 156/657; 156/659.1; 156/345; 204/192 E; 204/298; 252/79.1
[58] Field of Search ............... 156/643, 646, 653, 657, 156/659.1, 662, 345; 250/531; 252/79.1; 204/164, 192 E, 298; 427/38, 39

[56] References Cited

U.S. PATENT DOCUMENTS 3,880,684 4/1975 Abe .......................... 252/79.1 X
3,984,301 10/1976 Matsuzaki et al. .............. 204/192 E
4,233,109 11/1980 Nishizawa ..................... 156/345

OTHER PUBLICATIONS

J. Vac. Sci. Technol., vol. 13, No. 5, Sep./Oct. 1976, Dry Process Technology (Reactive Ion Etching) by James A. Bondur, pp. 1023–1029.

Primary Examiner—William A. Powell
Attorney, Agent, or Firm—James R. Bell; Marshall M. Truex

[57] ABSTRACT

A plasma etching process and apparatus wherein a gas plasma comprising dichlorofluoro-methane ($CHCl_2F$) etches a film.

1 Claim, 6 Drawing Figures

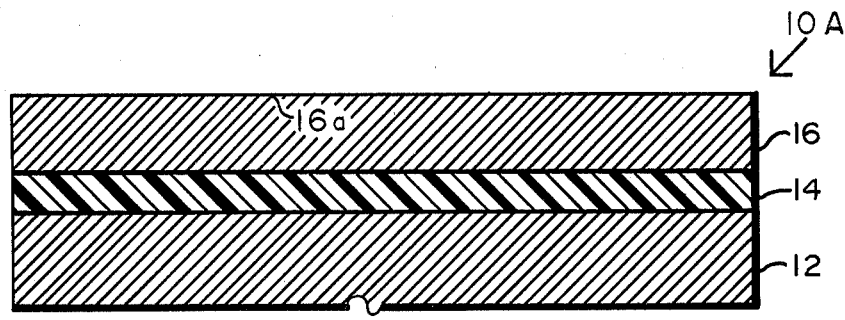
FIG. IA
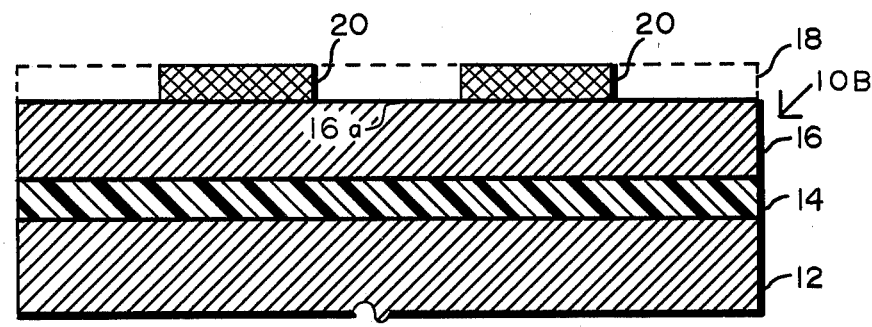
FIG. IB
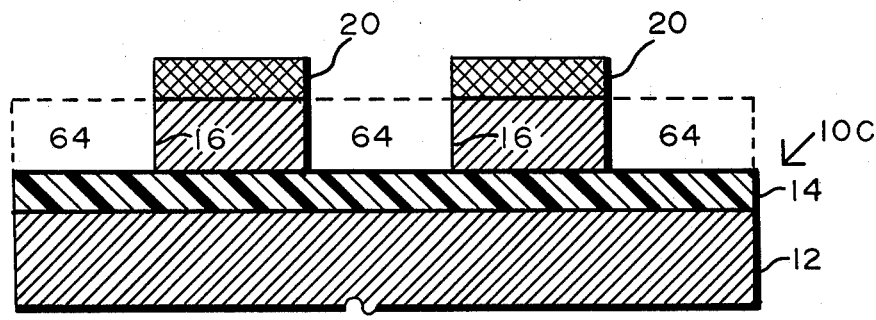
FIG. IC
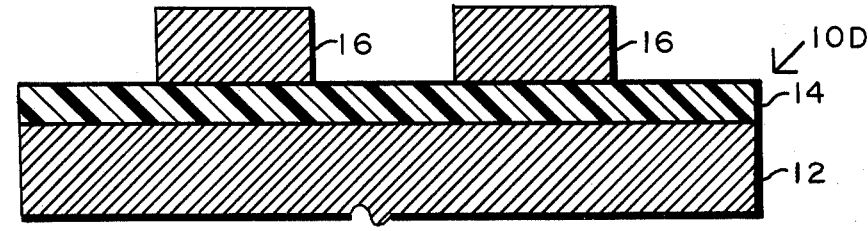
FIG. ID

PLASMA ETCHING PROCESS AND APPARATUS

This is a continuation of application Ser. No. 171,790, filed July 24, 1980, now abandoned.

BACKGROUND

This invention pertains to the fabrication of semi-conductor devices, and particularly to dry plasma etching processes used in such fabrication.

Semi-conductor devices, such as semi-conductor integrated circuits, typically comprise a substrate, or base, which has deposited thereon one or more film layers. Some such film layers have a dopant selectively diffused or otherwise loaded therein in accordance with a pattern indicative of the junctions to be formed in the integrated circuit. The pattern may correspond, for example, to portions of the film not temporarily covered by a photoresist or mask which shields the portions not to be doped. Before diffusing or loading the dopant into the film, however, select portions of the film layer must first be removed, or etched, in accordance with the desired pattern.

One known technique for etching a film is plasma etching. Plasma etching is the selective removal of material by reaction with chemically active gases created by a radio frequency (RF) power-induced glow discharge environment. In plasma etching, the RF voltage applied across the gas normally causes the gases to disassociate and to form various free radicals which chemically interact to etch away the select areas of the film for subsequent doping.

Apparatus used for plasma etching is of two basic types. In the first, one or more electrodes or an inductance coil is external to a vacuum chamber into which a semi-conductor workpiece is inserted. In the second type of apparatus, the workpiece is placed on a cathode which, along with an anode, is internally contained in the vacuum chamber.

While plasma etching is generally thought to be a cleaner, more economical, and more desirable technique than the wet chemical etching techniques heretofore known, various factors (such as the composition of the film-to-be-etched and any neighboring films, as well as the composition of the gas employed in the process) determine whether the particular plasma etching process employed overcomes various potential problems associated with the process. Such problems include, for example, the fact that in some processes the etching rate of the exposed portions of the film-to-be-etched is not significantly greater than that of neighboring or underlying films which are not to be etched. Likewise, in some instances, the gas plasma has a deleterious effect on the photoresist which serves to shield the portions of the film which are not to be etched.

Another important consideration in the plasma etching process is the degree of accuracy or sharpness with which the plasma etches only the selected portions of the film. The plasma should not, while etching an exposed portion of the film, undercut into a neighboring portion of the same film which is not to be etched.

Various semi-conductor devices currently available comprise a polycrystalline silicon (polysilicon) film deposited on a substrate. In many cases the substrate has an oxidized silicon coating onto which the polysilicon is deposited. However, the particular gases presently employed to etch a film, such as a polysilicon film, do not favorably solve problems such as those mentioned above.

SUMMARY

The invention pertains to a process and apparatus for a high resolution, dry plasma etching process for fabricating semi-conductor devices. A plasma comprising dichlorofluoro-methane ($CHCl_2F$) etches portions of a polysilicon film in a controlled reducing atmosphere.

In one embodiment of the invention, a workpiece is positioned on an electrode serving either as an anode or a cathode and which is contained in a vacuum chamber. In a second embodiment of the invention, the workpiece is positionable in a vacuum chamber having one or more electrodes or an inductance coil external thereto.

An object of the invention is the provision of a process and apparatus wherein a polysilicon film is etched in an efficient and economical manner without undercutting.

An advantage of the invention is the provision of a gas plasma which efficiently and sharply etches portions of a polysilicon film without damaging a photoresist material covering unexposed portions of the film.

Another advantage of the invention is the provision of a gas plasma which etches polysilicon at a rate of at least 15 times faster than the rate at which it etches silicon dioxide.

Yet another advantage of the invention is the provision of apparatus for practicing the process of the invention.

BRIEF DESCRIPTION OF THE DRAWINGS

The foregoing and other objects, features and advantages of the invention will be apparent from the following more particular description of the preferred embodiments of the invention, as illustrated in the accompanying drawings in which like reference characters refer to the same parts throughout different views. The drawings are not necessarily to scale, emphasis instead being placed upon illustrating the principles of the invention.

FIGS. 1A, 1B, 1C and 1D are cross-sectional views illustrating semi-conductor workpieces undergoing various fabrication steps included in the process of the invention; and, FIGS. 2A and 2B are schematic view of apparatus according to two differing embodiments of the invention.

DETAILED DESCRIPTION OF THE DRAWINGS

Figure 2A:
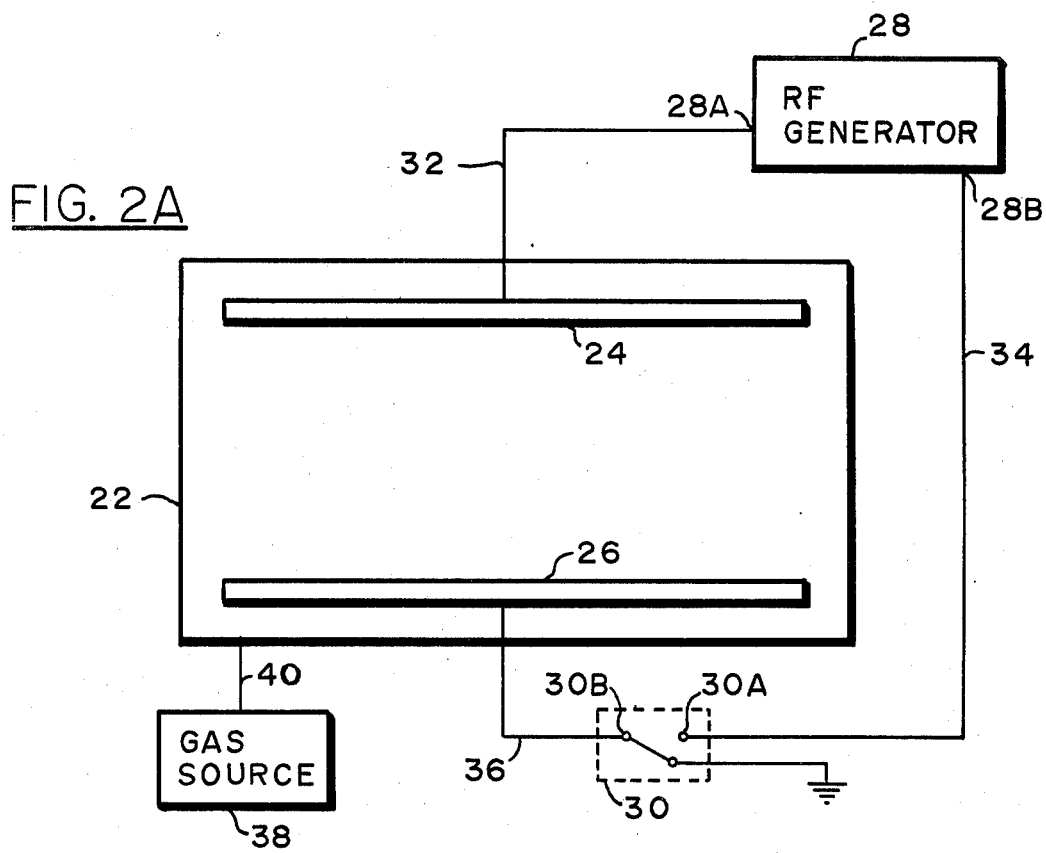

FIG. 1A illustrates a semi-conductor workpiece 10A at a stage of fabrication preliminary to the etching process of the invention. The workpiece 10A comprises a substrate 12 (only a portion of which is depicted in FIGS. 1A through 1D) which has been placed in a furnace or the like to produce a thin oxide film 14 thereon. In a preferred embodiment, the substrate 12 comprises silicon (Si) and the oxide film 14 comprises a silicon dioxide ($SiO_2$) layer approximating 700 angstroms (Å) in thickness. A film-to-be-etched 16, preferably of polycrystalline silicon (polysilicon), and preferably equal to or less than 5,000 Å, has been deposited on the substrate 12 and oxide film 14 by a conventional technique, such as chemical vapor deposition.

Subsequent to the fabrication step depicted in FIG. 1A, a photosensitive material (not shown in FIG. 1A) is applied to an upper surface 16a of the film-to-be-etched 16. The photosensitive material, such as a conventional photoresist, is photolithographically or otherwise patterned according to a junction pattern to be replicated in the underlying film 16. The photoresist is then processed to remove select portions thereof and thereby expose corresponding portions of the film-to-be-etched 16. The results of these fabrication steps are shown in FIG. 1B, wherein dashed lines 18 depict the photoresist as originally applied and the numerals 20 indicate the remaining photoresist portions which still cover portions of the film 16.

Figure 2B:
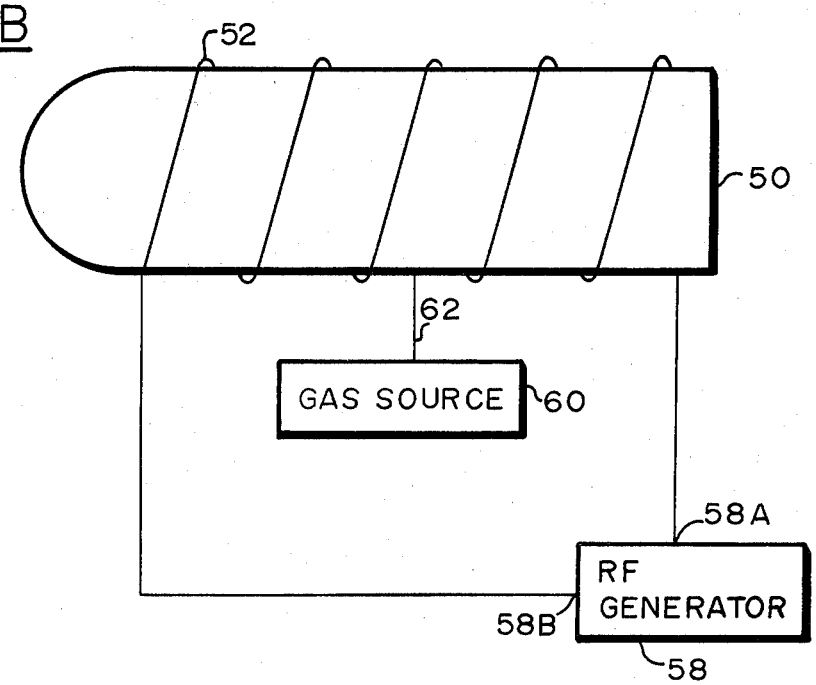

A workpiece 10B similar to that illustrated in FIG. 1B is then placed into apparatus resembling either the embodiment illustrated in FIG. 2A or FIG. 2B. The embodiment of FIG. 2A comprises a vacuum chamber 22 which may be constructed from various materials such as metal or glass, for example. A first electrode 24 and a second electrode 26 are positioned in parallel fashion within the vacuum chamber 22.

The apparatus of FIG. 2A also comprises an electrical circuit including a radio frequency (RF) generator 28 and an electrical switch 30. The RF generator has a first terminal 28A connected by a suitable wire 32 to the first electrode 24. A second terminal 28B of the RF generator 28 is connected by a wire 34 to terminal 30A of switch 30. Terminal 30B of switch 30 is connected by wire 36 to the second electrode 26.

The apparatus of FIG. 2A further comprises a source 38 of dichlorofluoro-methane ($CHCl_2F$) gas. The source 38 is in selective fluid communication with the vacuum chamber 22 by an appropriate fluid connector 40.

It should be understood that the embodiment of FIG. 2A may further incorporate other structural features which are not necessarily discussed herein. For example, a flowmeter and/or control valve may be positioned along the fluid connector 40 intermediate the source 38 and the chamber 22. Likewise, an exhaust port may be provided for selectively allowing gas to escape from the chamber 22. Other known features not specifically illustrated herein also include a matching network (operative in conjunction with the RF generator 28), electrode supports, and a vacuum pump.

In operating the embodiment of the apparatus illustrated in FIG. 2A, the RF generator 28 may be connected so that terminal 28A thereof corresponds either to a positive terminal or to a negative terminal, meaning that the first electrode 24 can function as either an anode or a cathode. For example, when terminal 28A of RF generator 28 is negative and terminal 28B is positive, the first electrode 24 functions as a cathode. Thus, depending on the manner in which the RF generator 28 is connected, either electrode 24 or 26 may function as an anode or cathode regardless of the location of the workpiece 10 within the chamber 22. In either mode, typical power levels are 0.20 to 0.70 watts/$cm^2$ at 13.5 MHz and chamber pressures are between 150 and 400 milli-torr.

In the embodiment of the apparatus illustrated in FIG. 2B, a vacuum chamber 50 has an inductance coil 52 wrapped therearound. The inductance coil 52 is powered by an radio frequency generator 58. One side of the coil 52 is connected to terminal 58A, and the other side of the coil 52 is connected to terminal 58B of the radio frequency generator 58.

As in the embodiment of FIG. 2A, a source of dichlorofluoro-methane gas 60 is in communication with the vacuum chamber 50 by a fluid connector 62. Again it should be understood that various appropriate structural features, such as a vacuum pump, matching network, flowmeter, and control valve may be incorporated into the embodiment of FIG. 2B although not necessarily illustrated as such.

The embodiment of FIG. 2B may also be oriented so that either first terminal 58A or second terminal 58B of the generator 58 is the neighboring terminal. Typical power levels for the operation of the embodiment of FIG. 2B are 0.1 to 0.4 watts/$cm^2$ at 13.5 MHz and pressures of 150 to 400 milli-torr.

Activation of the switches 30 and 54 in the embodiments of FIGS. 2A and 2B close the respective electrical circuits and thereby create a radio frequency power-induced glow discharge environment in the respective vacuum chambers 22 and 50. The RF voltage applied across the dichlorofluoro-methane gas supplied to the chambers causes the dichlorofluoro-methane to disassociate and to form various free radicals which chemically interact to etch away the select areas of the film 16 which are to be doped. FIG. 1C illustrates the appearance of a workpiece 10C upon completion of the etching process as conducted in either the embodiment of the apparatus illustrated in FIG. 2A or FIG. 2B, showing by dashed lines etched-away portions 64 of the film 16. The portions 64 are those select areas of the film 16 which are to be subsequently doped.

As illustrated in FIG. 1C, the oxide film 14 on substrate 12 is untouched by the etching process. Since it is very difficult to deposit the film 16 onto the workpiece 10 with a uniform thickness, it is likely that etching of some portions of the film may be completed before other portions. In such cases the oxide film 14 becomes and remains exposed to the plasma while the etching continues for other portions of the film. Thus, it is highly desirable that the etching rate of the film 16 be significantly greater than the etching rate of the oxide film 14. In this regard, when using dichlorofluoro-methane in accordance with this invention, the etching rate of polysilicon film (such as film 16) is greater than 15 times the etching rate of a film of silicon dioxide (such as film 14).

The etched-workpiece 10C of FIG. 1C also illustrates the sharpness with which the plasma etches only the select portions of the film 16. In this regard, the plasma does not undercut from the region 64 into the portions of the film which are not to be etched. Moreover, the plasma does not damage the photoresist material 20 covering the unexposed portions of the etched film 16.

Upon completion of the etching process as described above, the workpiece 10C of FIG. 1C is processed to remove the remaining photoresist portions 20. Such processing may be conducted by a number of standard techniques, resulting in a workpiece 10D appearing in FIG. 1D.

While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. A method of selectively etching a film comprising the steps of:

depositing a polycrystalline silicon film on an underlying substrate comprising silicon dioxide thereby forming a film-to-be-etched;

inserting said polycrystalline silicon film on said underlying substrate into a vacuum chamber;

supplying dichlorofluoro-methane gas to said vacuum chamber;

applying a radio frequency voltage across said dichlorofluoro-methane gas supplied to said chamber, thereby causing said gas to disassociate and form radicals which chemically interact to etch select areas of said film, said film being etched substantially without lateral etching and said select areas of said film being etched at a rate essentially 15 times greater than the etching rate of silicon dioxide comprising said substrate.

* * * * *